United States Patent
Kato

(10) Patent No.: US 6,717,207 B2
(45) Date of Patent: Apr. 6, 2004

(54) NON-VOLATILE SEMICONDUCTOR MEMORY DEVICE OF WHICH BIT LINE WITHSTAND VOLTAGE CAN BE INCREASED

(75) Inventor: Hiroshi Kato, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/211,338

(22) Filed: Aug. 5, 2002

(65) Prior Publication Data

US 2003/0141532 A1 Jul. 31, 2003

(30) Foreign Application Priority Data

Jan. 30, 2002 (JP) .......................... 2002-021289

(51) Int. Cl.$^7$ .............................. H01L 29/788
(52) U.S. Cl. .................... 257/316; 257/315; 257/326; 438/257; 438/424
(58) Field of Search ................... 257/315, 316, 257/326, 304; 438/257, 424

(56) References Cited

U.S. PATENT DOCUMENTS

| | | | |
|---|---|---|---|
| 5,679,591 A | * 10/1997 | Lin et al. | 438/257 |
| 5,768,192 A | 6/1998 | Eitan | |
| 5,851,879 A | * 12/1998 | Lin et al. | 438/257 |
| 6,011,725 A | 1/2000 | Eitan | |
| 6,081,456 A | 6/2000 | Dadashev | |
| 6,174,758 B1 | 1/2001 | Nachumovsky | |
| 6,512,263 B1 | * 1/2003 | Yuan et al. | 257/316 |
| 2002/0187615 A1 | * 12/2002 | Liou | 438/424 |

FOREIGN PATENT DOCUMENTS

| | | |
|---|---|---|
| JP | 63-108778 | 5/1988 |
| JP | 5-326976 | 12/1993 |

OTHER PUBLICATIONS

Eitan, et al, "Can NROM, A 2–Bit, Trapping Storage NVM Cell, Give A Real Challenge to Floating Gate Cells?" International Conference on Solid State Devices and Materials, Tokyo, 1999, pp. 1–3.

* cited by examiner

Primary Examiner—Son Mai
Assistant Examiner—Dao H. Nguyen
(74) Attorney, Agent, or Firm—McDermott, Will & Emery

(57) ABSTRACT

A non-volatile semiconductor memory device according to the present invention includes: a plurality of element isolation regions formed at predetermined intervals in the main surface of a semiconductor substrate; a first silicon oxide film, a nitride film and a second silicon oxide film formed on the semiconductor substrate; a word line formed on the second silicon oxide film; an interlayer insulating film formed on the word line; a plurality of bit lines formed on the interlayer insulating film in a plurality of regions positioned above the plurality of element isolation regions; and an interlayer insulating film formed between the bit lines. Accordingly, in this non-volatile semiconductor memory device, the withstand voltage between the bit lines increases and, therefore, the occurrence of current leakage can be prevented so that an improvement in performance can be implemented. In addition, the manufacturing cost can be lowered.

13 Claims, 17 Drawing Sheets

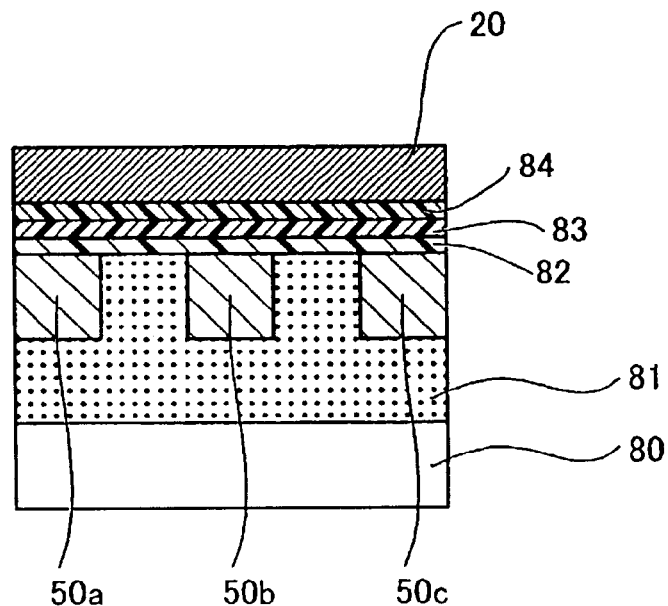
FIG.13A
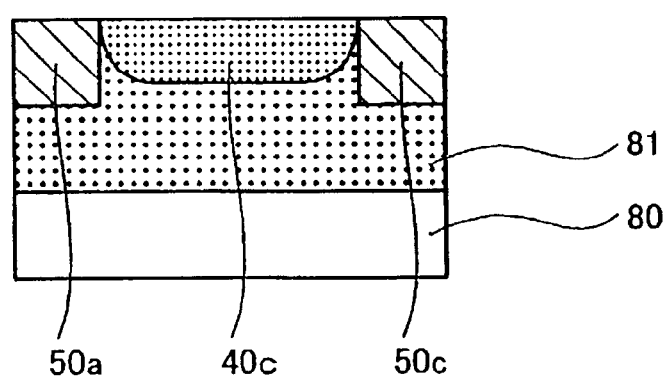
FIG.13B

NON-VOLATILE SEMICONDUCTOR MEMORY DEVICE OF WHICH BIT LINE WITHSTAND VOLTAGE CAN BE INCREASED

BACKGROUND OF THE INVENTION

1. Field of the Invention

The present invention relates to a non-volatile semiconductor memory device, and more particularly to a non-volatile semiconductor memory device wherein storage of binary values is possible.

2. Description of the Background Art

An NROM (nitride read-only memory) type flash EEPROM (hereinafter referred to as NROM), which is a type of flash EEPROM, has been gaining attention as a type of non-volatile semiconductor memory device. An NROM has been reported in U.S. Pat. No. 6,011,725 and U.S. Pat. No. 5,768,192.

FIG. 18 is a layout view showing a portion of a memory cell array of an NROM according to a prior art.

In reference to FIG. 18, the memory cell array of the NROM includes a plurality of word lines 1 arranged in rows and a plurality of bit lines 2 arranged in columns. Each memory cell MC is arranged in a region 3 surrounded by dotted lines.

FIG. 19 is a schematic cross sectional view along line segment XIX—XIX in FIG. 18.

In reference to FIG. 19, bit lines 2 are formed at predetermined intervals on the main surface of a p well 10. A bit line 2 is a diffusion bit line formed as an n-type diffusion region. A silicon oxide film 11 is formed on each bit line 2. A silicon oxide film 12 is formed on the main surface of p well 10 between two bit lines 2. A nitride film 13 for storing a charge is formed on silicon oxide film 12. A silicon oxide film 14 is formed on nitride film 13. A word line 1 is formed above silicon oxide films 14 and 11. Word line 1 is formed of polysilicon.

As shown in FIG. 19, a charge storage portion of a memory cell of the NROM has a layered structure (hereinafter referred to as an ONO layered structure) of silicon oxide film 12, nitride film 13 and silicon oxide film 14. In the NROM a charge of one bit is stored in a region, positioned above each bit line 2, at each of the two ends of nitride film 13 in the ONO layered structure. According to the above-described structure, two bits can be stored in one memory cell of the NROM. In addition, as shown in FIG. 18, memory cells next to each other with a bit line between them share bit line 2 placed between the neighboring memory cells as a source or a drain.

As a result, the area occupied for one bit is greatly reduced to 2.5 $F^2$ in the NROM in comparison with 5 $F^2$ to 15 $F^2$ in a conventional NOR-type flash EEPROM.

As described above, an enhancement of integration is possible in the NROM and cost can be reduced.

As shown in FIG. 19, however, element isolation regions do not exist between the bit lines of the NROM unlike in the conventional flash EEPROM. Accordingly, the withstand voltage between bit lines deteriorates leading to the possibility of the occurrence of charge leakage.

In addition, as shown in FIG. 19, bit line 2 of the NROM is formed through diffusion. Accordingly, the electrical resistance of the bit line is high. As a result, there is a possibility that the performance of the NROM may be inferior to that of the conventional flash EEPROM.

SUMMARY OF THE INVENTION

An object of the present invention is to provide a non-volatile semiconductor memory device wherein the occurrence of current leakage is prevented by increasing the withstand voltage between bit lines so that an increase in performance can be implemented and of which the cost of manufacture is inexpensive.

A non-volatile semiconductor memory device according to the present invention includes a semiconductor substrate of a first conductive type having a main surface, a plurality of conductive regions of a second conductive type, a plurality of insulating regions, a first insulating film, a charge storage film, a second insulating film and a plurality of conductive lines. The plurality of conductive regions is formed in the main surface of the semiconductor substrate. The plurality of insulating regions is formed in the main surface of the semiconductor substrate and is arranged so as to alternate with the plurality of conductive regions. The first insulating film is formed on the main surface of the semiconductor substrate. The charge storage film is formed on the first insulating film and has a plurality of storage regions. The second insulating film is formed on the charge storage film. The plurality of conductive lines is formed on the second insulating film.

According to the present invention, an isolation oxide film is formed between each pair of bit lines in the layout of the memory cell array of the non-volatile semiconductor memory device. Accordingly, the withstand voltage between bit lines is increased so that charge leakage can be restricted.

Furthermore, bit lines are formed of a metal instead of being diffusion bit lines and, therefore, the resistance of the bit lines can be reduced. As a result, the performance of the non-volatile semiconductor memory device can be increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7 to 15B are schematic cross sectional views for describing the first to eighth steps of a manufacturing process for a non-volatile semiconductor memory device according to a first embodiment;

DESCRIPTION OF THE PREFERRED EMBODIMENTS

Figure 1:
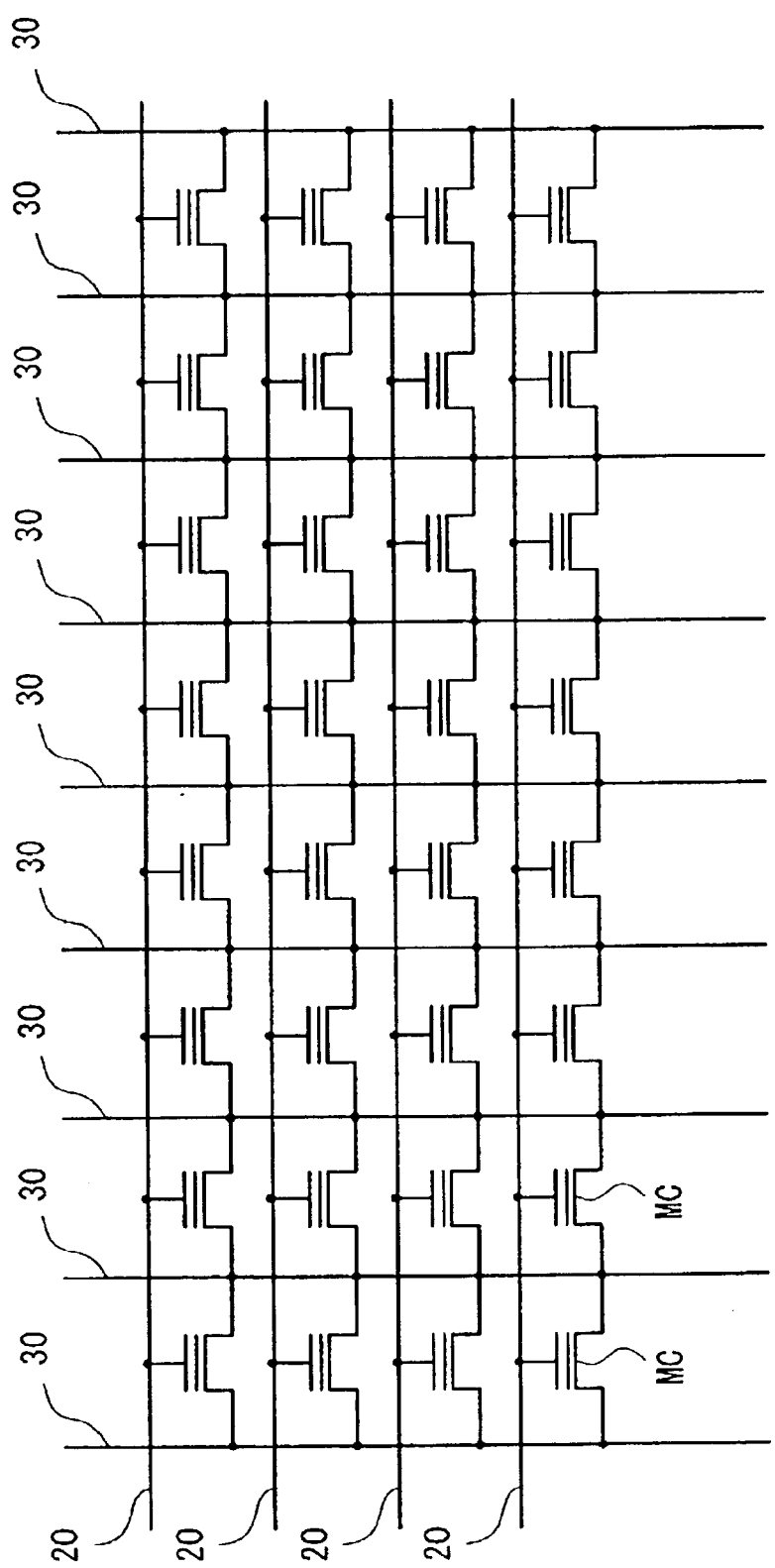
FIG. 1 is a circuit diagram showing in detail the configuration of a memory cell array block of a non-volatile semiconductor memory device according to an embodiment of the present invention.

In the following, the embodiments of the present invention are described in detail in reference to the drawings. Here, the same symbols are attached to the same or corresponding parts in the drawings, of which the descriptions are not repeated.

(First Embodiment)

FIG. 1 is a circuit diagram showing in detail the configuration of a memory cell array block of a non-volatile semiconductor memory device according to an embodiment of the present invention.

In reference to FIG. 1, the memory cell array block is provided with a plurality of non-volatile memory cells MC, a plurality of word lines 20 and a plurality of bit lines 30.

The plurality of word lines 20 is arranged in rows and the plurality of bit lines 30 is aligned in columns, respectively.

The plurality of non-volatile memory cells MC is arranged so that the respective cells are in the regions surrounded by word lines 20 and bit lines 30. A plurality of non-volatile memory cells MC arranged so as to correspond to a plurality of regions located in the same row is connected in series so that the gates thereof are connected to the same word lines 20. Here, bit lines 30 are aligned so as to pass through connection points between two neighboring non-volatile memory cells MC.

Here, a non-volatile memory cell MC has two storage regions.

In the following, the operations of writing data into and of reading data from such a non-volatile memory cell are described.

FIGS. 2A to 2D are schematic diagrams showing the operations of writing data into and of reading data from a non-volatile memory cell.

Figure 2A:
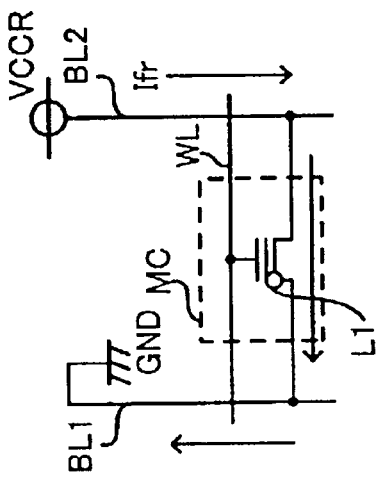
FIGS. 2A to 2D are schematic diagrams showing the operations of writing data into and of reading data from a non-volatile memory cell.
Figure 2B:
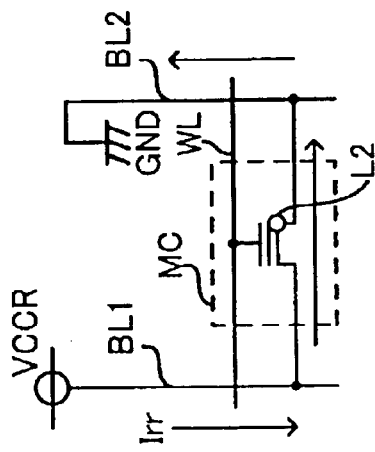
Figure 2C:
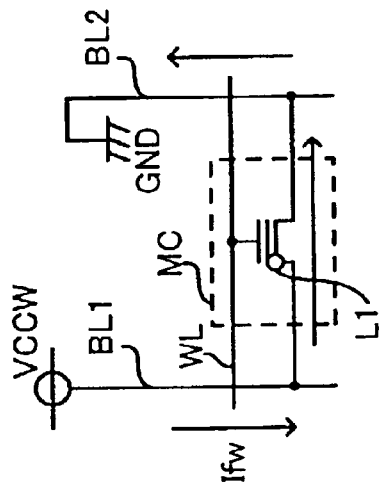
Figure 2D:
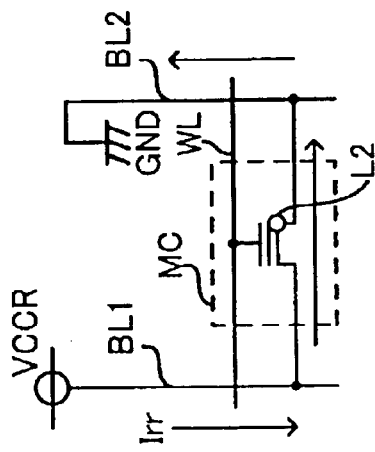

In reference to FIG. 2A, the gate of a non-volatile memory cell MC is connected to a word line WL. In addition, non-volatile memory cell MC is connected to bit lines BL1 and BL2. Non-volatile memory cell MC has a storage region L1 on the bit line BL1 side and has a storage region L2 on the bit line BL2 side as shown in FIG. 2C.

First, the operation of writing into storage region L1 is described. In reference to FIG. 2A, in the case that data is written into storage region L1, the potential of bit line BL1 is maintained at writing potential VCCW while the potential of bit line BL2 is maintained at ground potential GND. As a result, writing current Ifw flows from bit line BL1 to bit line BL2 through non-volatile memory cell MC. At this time, data is written into storage region L1.

Next, the operation of reading data from storage region L1 is described. In reference to FIG. 2B, in the case that data is read from storage region L1, the potential of bit line BL1 is maintained at ground potential GND while the potential of bit line BL2 is maintained at reading potential VCCR. As a result, reading current Ifr flows from bit line BL2 to bit line BL1. At this time, data in storage region L1 is read out.

As shown in the above, the direction of current that flows at the time of writing operation and the direction of current that flows at the time of reading operation become opposite to each other in memory region L1.

The operation of writing into storage region L2 is described. In reference to FIG. 2C, in the case of writing data into storage region L2, the potential of bit line BL1 is maintained at ground potential GND while the potential of bit line BL2 is maintained at writing potential VCCW. As a result, writing current Irw flows from bit line BL2 to bit line BL1. At this time, data is written into storage region L2.

Next, the operation of reading data from storage region L2 is described. In reference to FIG. 2D, in the case of reading data from storage region L2, the potential of bit line BL1 is maintained at reading potential VCCR while the potential of bit line BL2 is maintained at ground potential GND. As a result, reading current Irr flows from bit line BL1 to bit line BL2. At this time, data of storage region L2 is read out.

As shown in the above, the direction of current that flows at the time of writing operation and the direction of current that flows at the time of reading operation also become opposite to each other in storage region L2.

Figure 3:
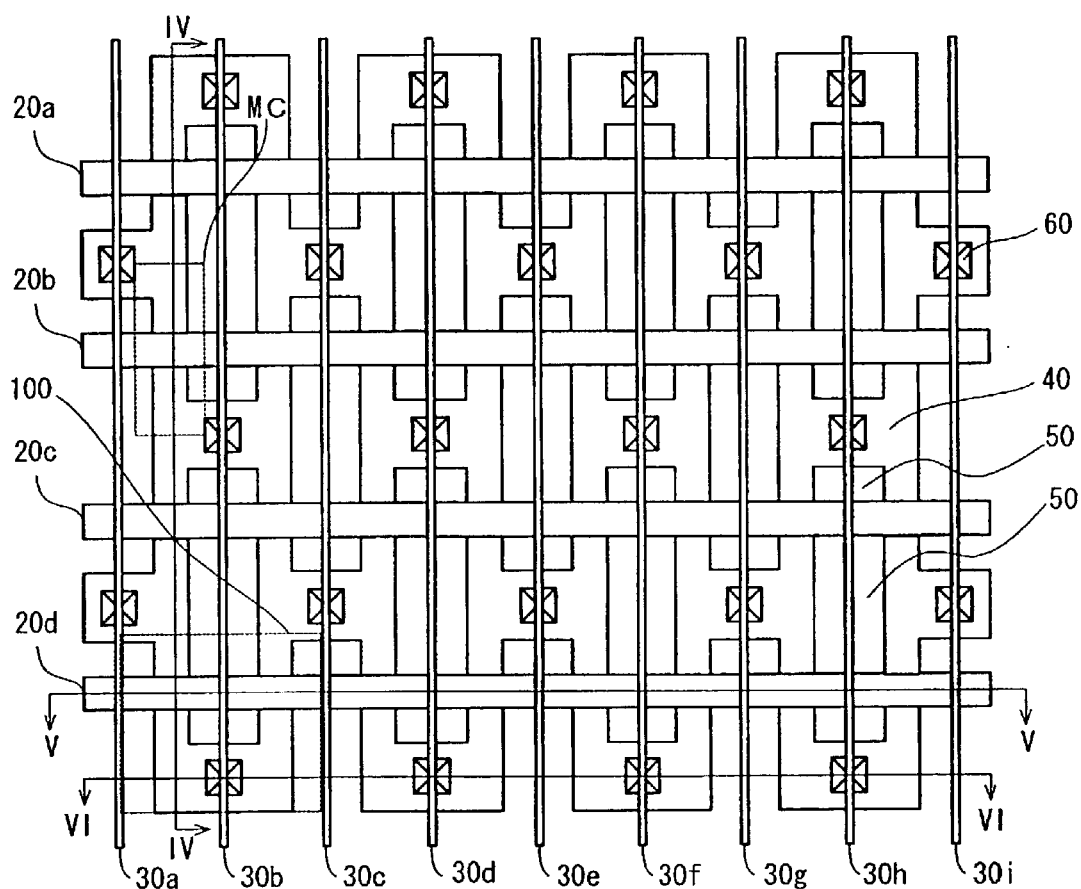
FIG. 3 is a layout view showing the configuration of the memory cell array of the non-volatile semiconductor memory device according to the mode of the present invention.

FIG. 3 is a layout view showing the configuration of the memory cell array of the non-volatile semiconductor memory device according to the embodiment of the present invention.

In reference to FIG. 3, a plurality of word lines 20a to 20d are aligned in rows while a plurality of bit lines 30a to 30i are arranged in columns. N wells 40 and element isolation regions 50 are alternately arranged, relative to a column, between neighboring word lines 20a and 20b. Element isolation regions 50 are formed of a silicon oxide film. N wells 40 and element isolation regions 50 are alternately aligned between word lines 20b and 20c, between word lines 20c and 20d and between other word lines in the same manner.

Bit lines 30a to 30i are arranged above n wells 40. Bit lines 30a to 30i and n wells 40 located beneath them are connected via contact holes 60.

Figure 4:
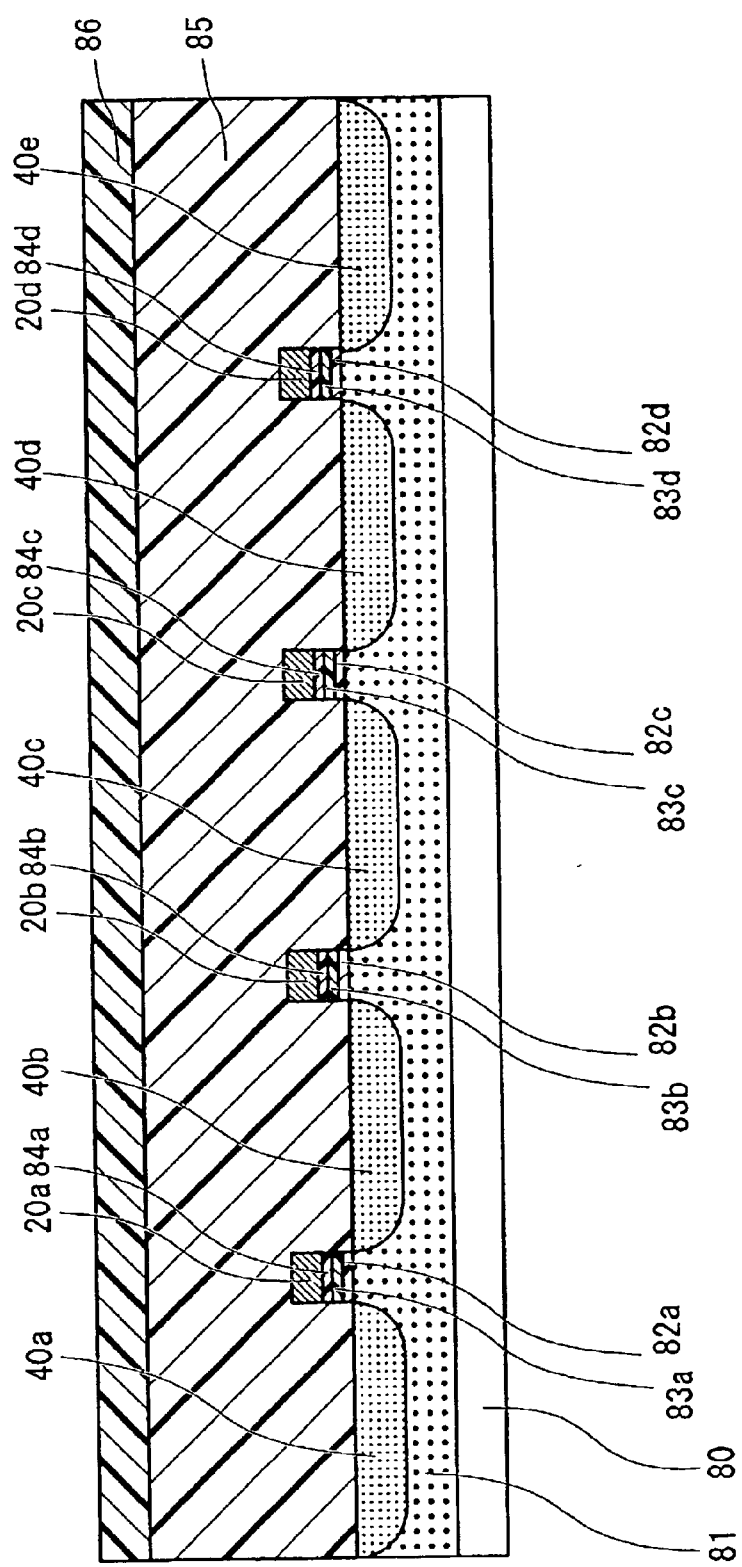
FIG. 4 is a schematic cross sectional view along line segment IV—IV in FIG. 3.

FIG. 4 is a schematic cross sectional view along line segment IV—IV in FIG. 3. FIG. 4 is a schematic cross sectional view in the direction of the bit lines.

In reference to FIG. 4, a p well 81 is formed in a region of a predetermined depth from the main surface of a semiconductor substrate 80. N-type diffusion regions 40a to 40d are formed at predetermined intervals in the main surface of semiconductor substrate 80. A silicon oxide film 82a is formed on the main surface of semiconductor substrate 80 between n-type diffusion regions 40a and 40b. In the same manner, a silicon oxide film 82b is formed on the main surface of semiconductor substrate 80 between n-type diffusion regions 40b and 40c. In the same manner, a silicon oxide film 82c is formed between n-type diffusion regions 40c and 40d and a silicon oxide film 82d is formed between n-type diffusion regions 40d and 40e.

Nitride films 83a to 83d for storing charge are formed on silicon oxide films 82a to 82d. Nitride film 83a has two storage regions, one on the n-type diffusion region 40a side and the other on the n-type diffusion region 40b side, respectively. As a result, one memory cell can store two bits. In the same manner, nitride films 83b to 83d respectively have two storage regions.

Silicon oxide films 84a to 84d are formed on nitride films 83a to 83d. Word lines 20a to 20d are formed on silicon oxide films 84a to 84d. Word lines 20a to 20d are formed of polysilicon. An interlayer insulating film 85 is formed above the main surface of semiconductor substrate 80 in regions located on n-type diffusion regions 40a to 40e and on word lines 20a to 20d. An interlayer insulating film 86 is formed on interlayer insulating film 85.

In FIG. 4, n-type diffusion region 40a and n-type diffusion region 40b work as a source region or a drain region of one non-volatile memory cell. These n-type diffusion regions, silicon oxide film 82a, nitride film 83a having two storage regions, silicon oxide film 84a and word line 20a form the first non-volatile memory cell. In addition, n-type diffusion region 40b, n-type diffusion region 40c, silicon oxide film 82b, nitride film 83b, silicon oxide film 84b and word line 20b form the second non-volatile memory cell. At this time, n-type diffusion region 40b works as a source/drain region shared by the first and second non-volatile memory cells.

In the same manner, n-type diffusion region 40c, n-type diffusion region 40d, silicon oxide film 82c, nitride film 83c, silicon oxide film 84c and word line 20c form the third non-volatile memory cell and n-type diffusion region 40d, n-type diffusion region 40e, silicon oxide film 82d, nitride film 83d, silicon oxide film 84d and word line 20d form the fourth non-volatile memory cell.

Figure 5:
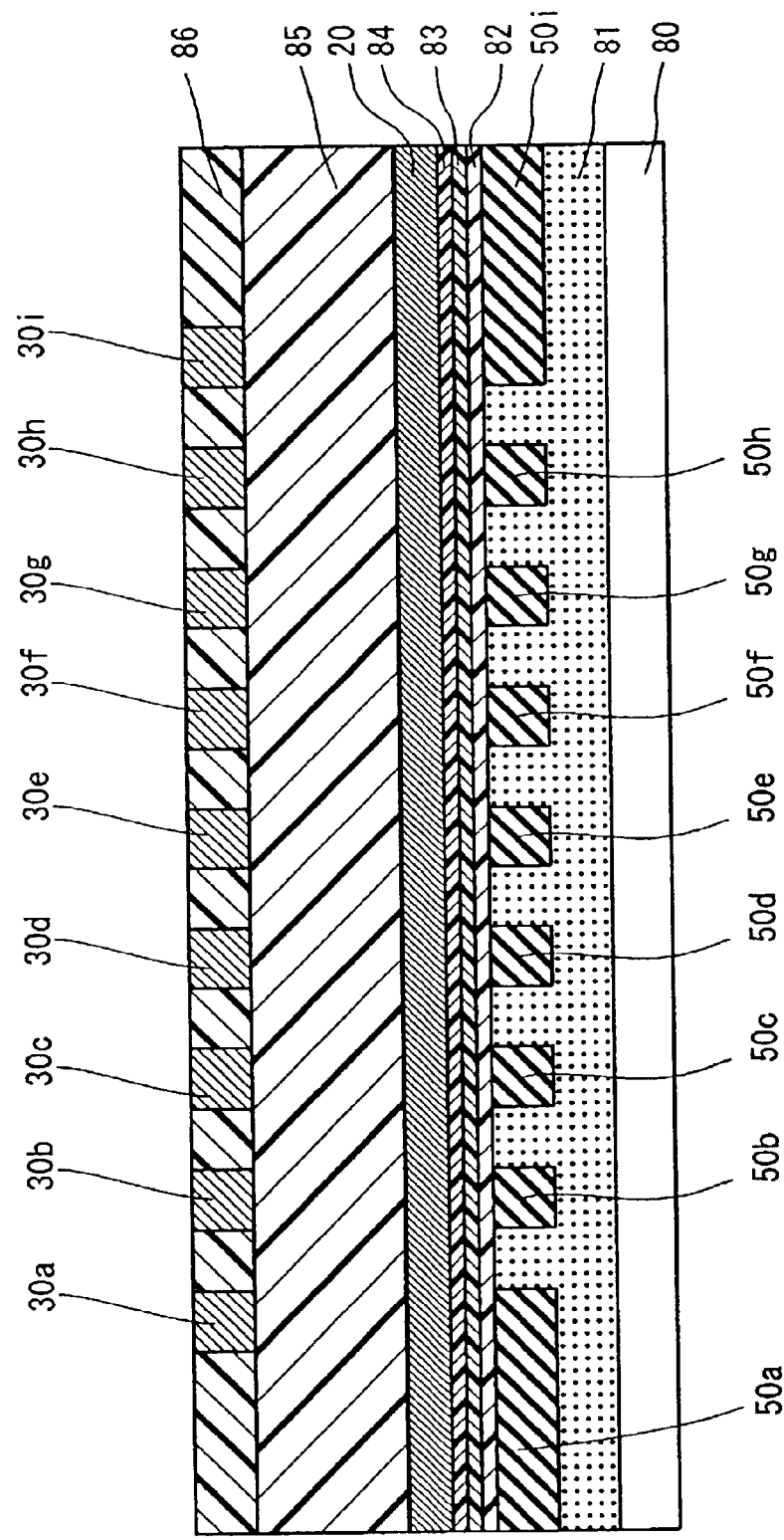
FIG. 5 is a schematic cross sectional view along line segment V—V in FIG. 3.

FIG. 5 is a cross sectional view along line segment V—V in FIG. 3. FIG. 5 is a cross sectional view in the direction of the word lines.

In reference to FIG. 5, p well 81 is formed in the region of the predetermined depth from the main surface of semiconductor substrate 80. In addition, element isolation regions 50a to 50i are formed at predetermined intervals in the main surface of semiconductor substrate 80. Element isolation regions 50a to 50i are formed of silicon oxide films. A region between element isolation regions 50a and 50b is a channel region of a memory cell MC. In the same manner, regions between the respective element isolation regions are channel regions of respective memory cells MC.

A silicon oxide film 82 is formed on the main surface of semiconductor substrate 80. A nitride film 83 for storing charge is formed on silicon oxide film 82. A silicon oxide film 84 is formed on nitride film 83. Word line 20 is formed on silicon oxide film 84. Interlayer insulating film 85 is formed on word line 20. Bit lines 30a to 30i are formed in the regions located above element isolation regions 50a to 50i, respectively. An aluminum-silicon-copper (Al—Si—Cu) alloy film can be used as a material for bit lines 30a to 30i. Interlayer insulating film 86 is formed between the bit lines.

Figure 6:
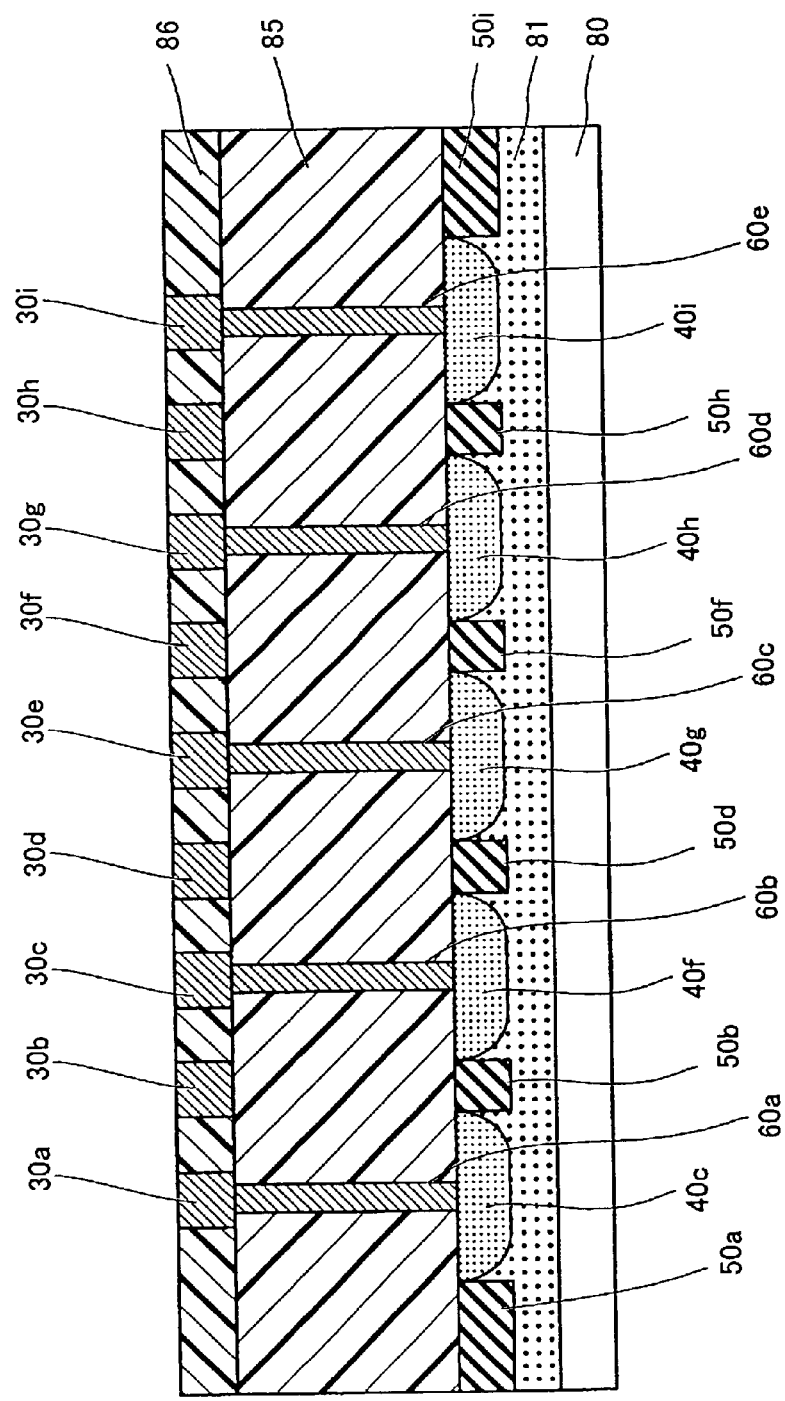
FIG. 6 is a schematic cross sectional view along line segment VI—VI in FIG. 3.

FIG. 6 is a cross sectional view along line segment VI—VI in FIG. 3.

In reference to FIG. 6, p well 81 is formed in the region of the predetermined depth from the main surface of semiconductor substrate 80. In addition, element isolation regions 50a to 50i are formed at predetermined intervals in the main surface of semiconductor substrate 80. Element isolation regions 50a, 50b, 50d, 50f, 50h and 50i are formed at predetermined intervals in the main surface of semiconductor substrate 80. N-type diffusion region 40c is formed between element isolation regions 50a and 50b in the main surface of semiconductor substrate 80. In the same manner, n-type diffusion region 40f is formed between element isolation regions 50b and 50d. N-type diffusion region 40g is formed between element isolation regions 50d and 50f. N-type diffusion region 40h is formed between element isolation regions 50f and 50h and n-type diffusion region 40i is formed between element isolation regions 50h and 50i.

Interlayer insulating film 85 is formed on the main surface of semiconductor substrate 80. Bit lines 30a to 30i are formed on interlayer insulating film 85 at predetermined intervals in the same manner as in FIG. 5 and interlayer insulating film 86 is formed between the respective bit lines.

Portions of interlayer insulating film 85 are partially removed from regions located above n-type diffusion regions 40c and 40f to 40i and, thereby, contact holes 60a to 60e are created. Surfaces of n-type diffusion regions 40c and 40f to 40i are exposed at the bottoms of these contact holes 60a to 60e. Bit lines 30a, 30c, 30e, 30g and 30i extend to the bottoms of contact holes 60a to 60e so as to be connected to n-type diffusion regions 40c and 40f to 40i, respectively.

A manufacturing process for the non-volatile semiconductor memory device having the above described structure is described below.

FIGS. 7 to 13 are schematic cross sectional views for describing the manufacturing process for the non-volatile semiconductor memory device of the present invention. Here, FIGS. 7 to 9 and FIG. 11A, FIG. 12A, FIG. 13A and FIG. 14A show schematic cross sectional views along line segment V—V within region 100 in FIG. 3 while FIG. 11B, FIG. 12B, FIG. 13B and FIG. 14B show schematic cross sectional views along line segment VI—VI within region 100 in FIG. 3.

Figure 7:
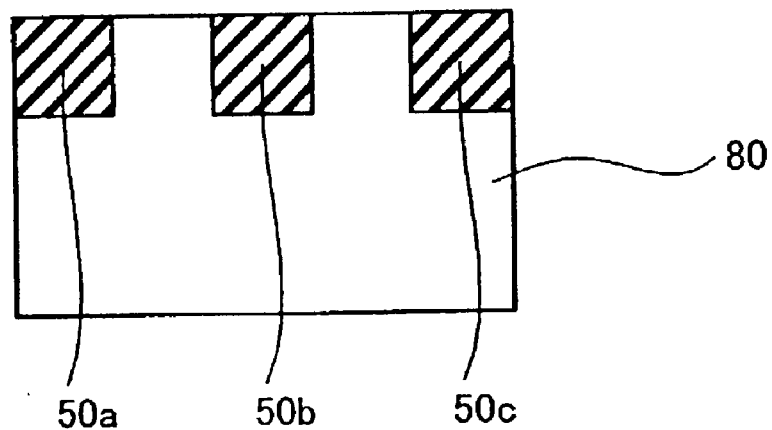

In reference to FIG. 7, element isolation regions 50a, 50b and 50c are formed in the main surface of semiconductor substrate 80 that is a p-type semiconductor substrate. Element isolation regions 50a, 50b and 50c are formed as trench isolations.

Figure 8:
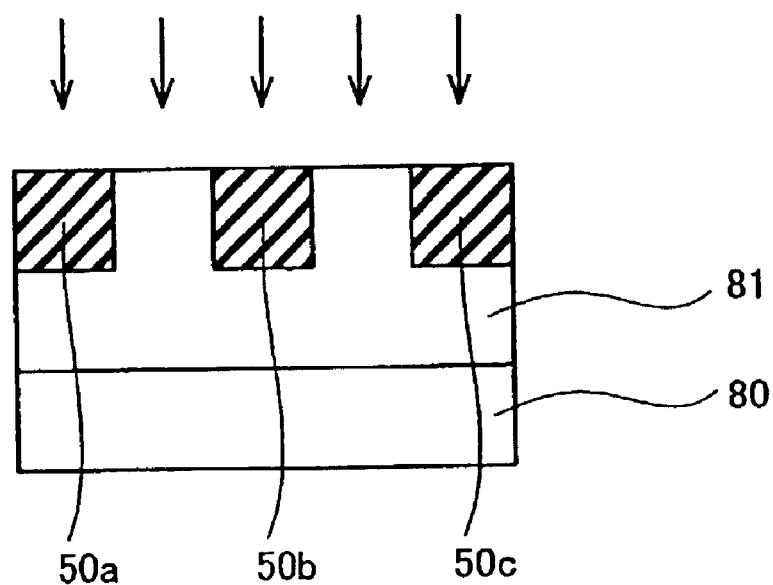

Next, boron is implanted into semiconductor substrate 80. Thereby, p well 81 is formed as shown in FIG. 8.

Figure 9:
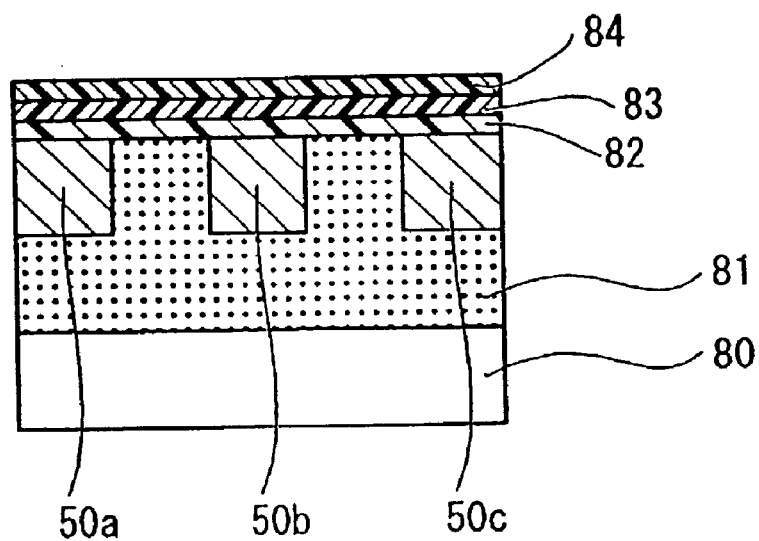

Next, as shown in FIG. 9, silicon oxide film 82 is formed by using a thermal oxidation method on the main surface of semiconductor substrate 80. Next, nitride film 83 is formed on silicon oxide film 82. Nitride film 83 is formed by using a low pressure CVD (chemical vapor deposition) method. After that, silicon oxide film 84 is formed on nitride film 83.

Figure 10:
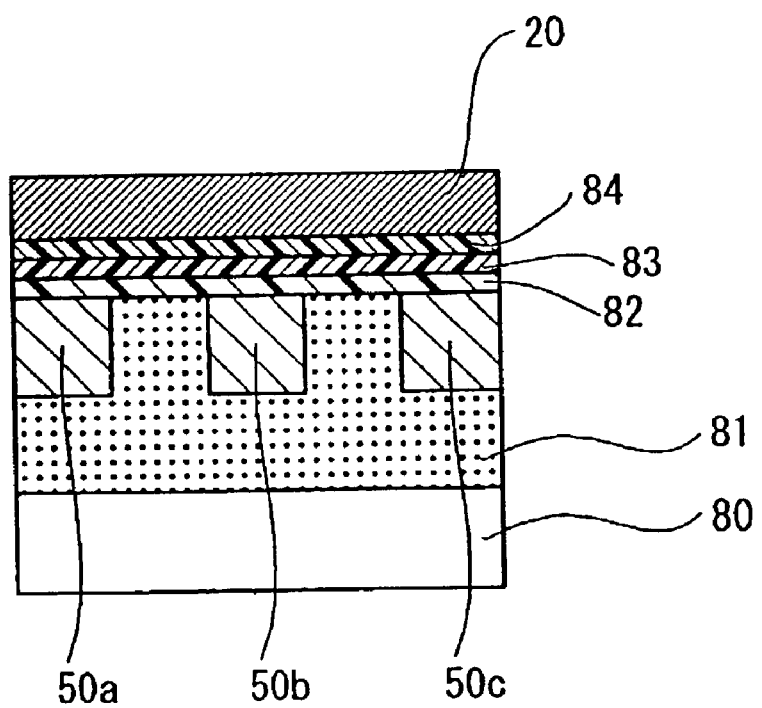

Next, as shown in FIG. 10, word line 20 is formed on silicon oxide film 84. The material used for word line 20 is polysilicon, which is formed by using a low pressure CVD method.

Figure 11A:
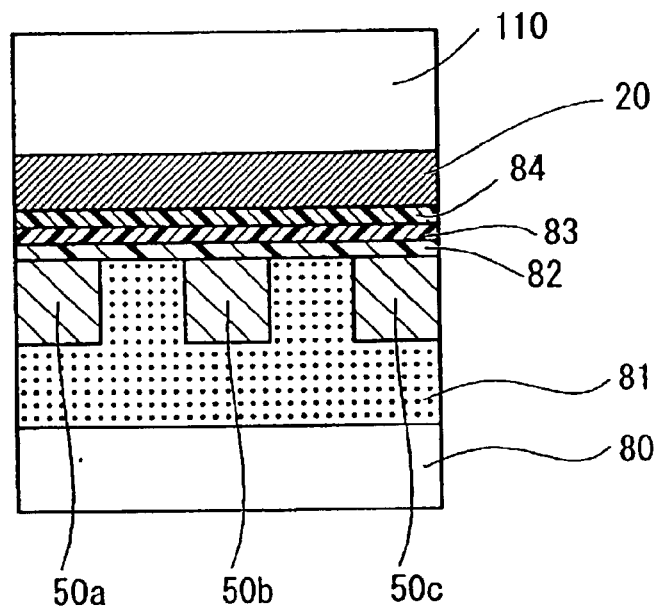
Figure 11B:
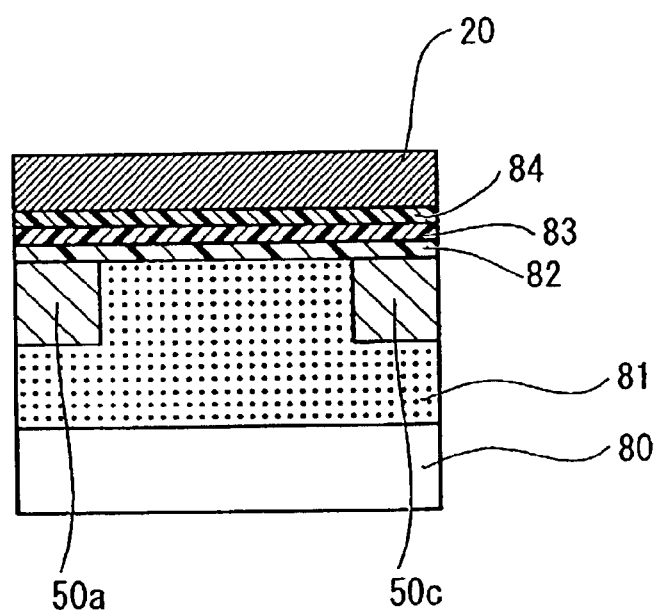

Next, a resist film 110 having a predetermined pattern is formed on word line 20 by using a photolithographic method. As a result, resist film 110 is formed on word line 20, as shown in FIG. 11A, in the cross section (hereinafter referred to as V—V cross section) along line segment V—V within region 100 in FIG. 3. As shown in FIG. 11B, however, resist film 110 is not formed in the cross section (hereinafter referred to as VI—VI cross section) along line segment VI—VI within region 100 in FIG. 3.

Figure 12A:
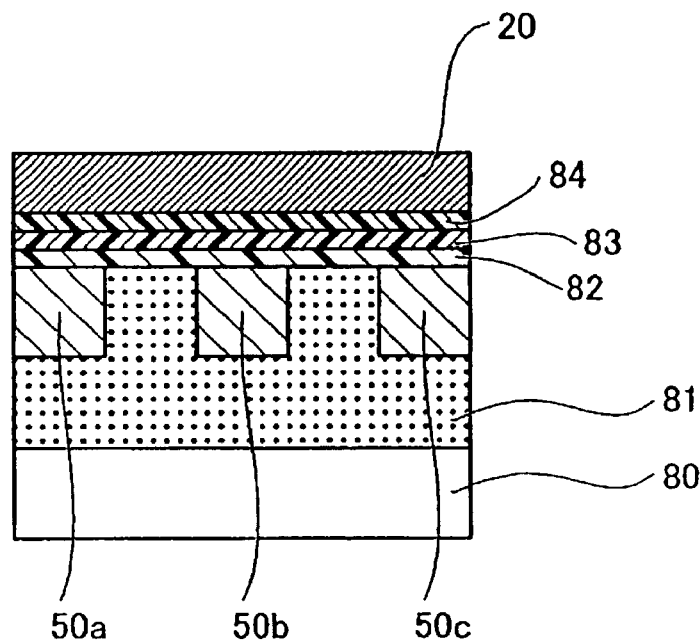
Figure 12B:
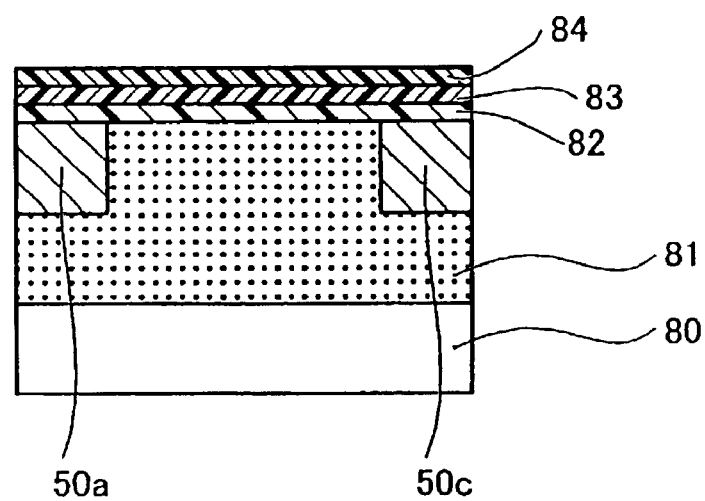

This resist film 110 is used as a mask so as to partially remove word line 20. As a result, as shown in FIG. 12B, word line 20 is removed in the VI—VI cross section. On the other hand, as shown in FIG. 12A, resist film 110 is formed on word line 20 in the V—V cross section and, therefore, word line 20 in the V—V cross section is not removed.

Then, silicon oxide film 84, nitride film 83 and silicon oxide film 82 are partially removed. As a result, as shown in FIG. 13B, silicon oxide film 84, nitride film 83 and silicon oxide film 82 are removed in the VI—VI cross section. On the other hand, as shown in FIG. 13A, word line 20, silicon oxide film 84, nitride film 83 and silicon oxide film 82 remain unchanged in the V—V cross section without undergoing etching.

As a result, the memory cell array becomes of the condition where a plurality of word lines 20 are arranged in rows. On the other hand, the regions wherein word line 20 does not exist become of the condition wherein the main surface of semiconductor substrate 80 is exposed. After that, resist film 110 is removed.

Next, arsenic ions are implanted in the regions within the memory cell array wherein word line 20 does not exist and the main surface of semiconductor substrate 80 is exposed. After that, heat treatment is carried out by placing semiconductor substrate 80 in a nitrogen atmosphere at a predetermined temperature. This heat treatment activates the arsenic ions and, as a result, n-type diffusion region 40c is formed in the main surface of semiconductor substrate 80 in the VI—VI cross section, as shown in FIG. 13B.

Figure 14A:
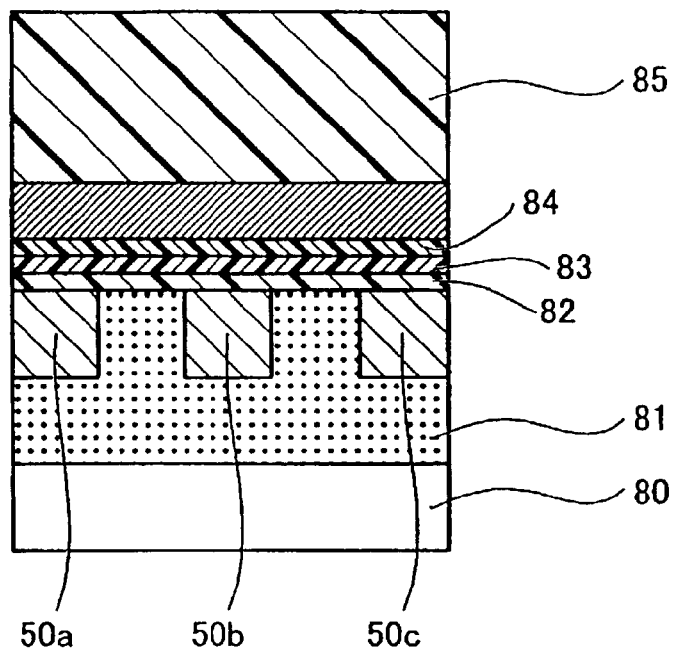
Figure 14B:
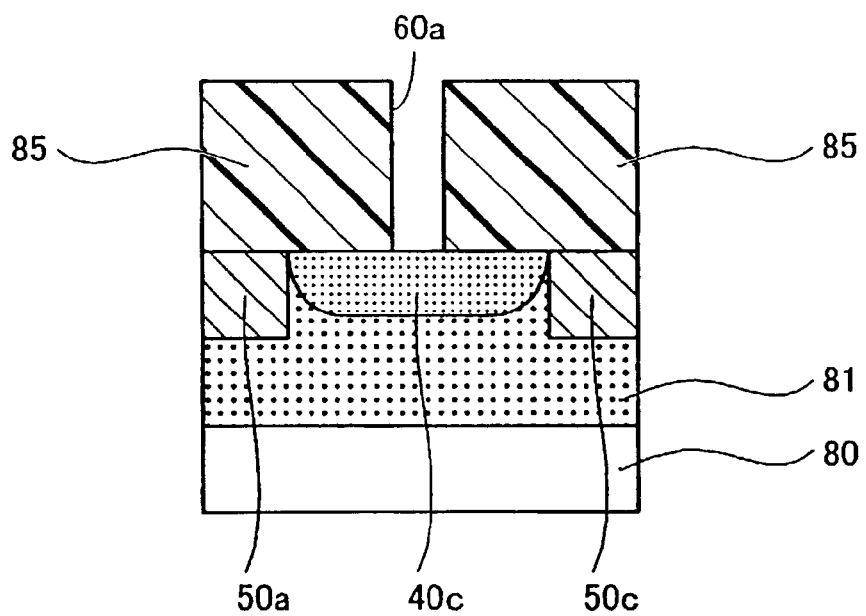

Next, interlayer insulating film 85 is formed on the plurality of word lines 20 within the memory cell array and on the main surface of semiconductor substrate 80. Interlayer insulating film 85 is formed by using a CVD method and, after that, the interlayer insulating film is hardened by carrying out heat treatment on semiconductor substrate 80. A resist film (not shown) is formed on this interlayer insulating film 85 using a lithographic method. This resist film is used as a mask to etch interlayer insulating film 85. As a result, interlayer insulating film 85 is partially removed in the VI—VI cross section, as shown in FIG. 14B, so that contact hole 60a is created. On the other hand, as shown in FIG. 14A, interlayer insulating film 85 is not etched in the V—V cross section. After this, the resist film is removed.

Figure 15A:
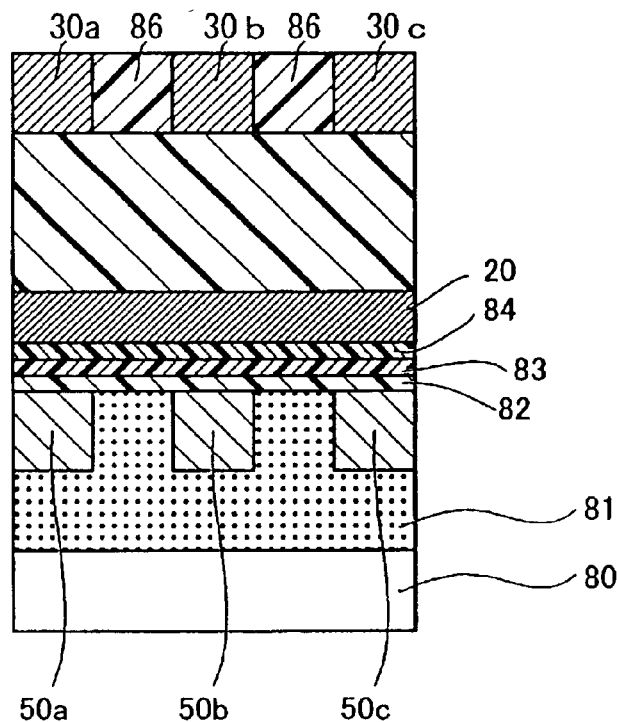
Figure 15B:
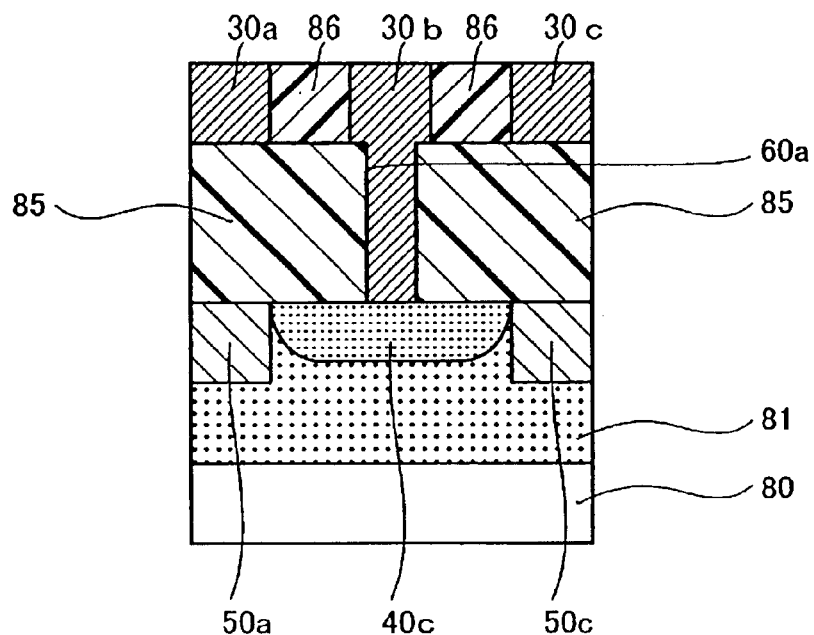

Next, an aluminum-silicon-copper (Al—Si—Cu) alloy film is formed as a conductive film so as to extend from the inside of contact hole 60a to the upper surface of interlayer insulating film 85 by using a sputtering method. A resist film (not shown) having a wiring pattern is formed on this alloy film by means of a photographic method. The alloy film is partially etched and removed by using this resist film as a mask. As a result, bit lines 30a to 30c aligned in columns are formed. After that, interlayer insulating film 86 is formed in the regions wherein the alloy film has been removed through etching. Thereby, the structure shown in the V—V cross section of FIG. 15A and shown in the VI—VI cross section of FIG. 15B can be gained.

(Second Embodiment)

The non-volatile semiconductor memory device shown in the first embodiment has the configuration wherein one memory cell can store two bits by using nitride film 83.

In the same manner as of the above nitride film, a silicon oxide film that includes a great number of polysilicon microscopic bodies can be used as a charge storage layer of one non-volatile memory cell in order to store two bits. A non-volatile memory cell wherein a silicon oxide film including polysilicon microscopic bodies is used as a charge storage layer has been reported in U.S. Pat. No. 6,011,725.

Figure 16:
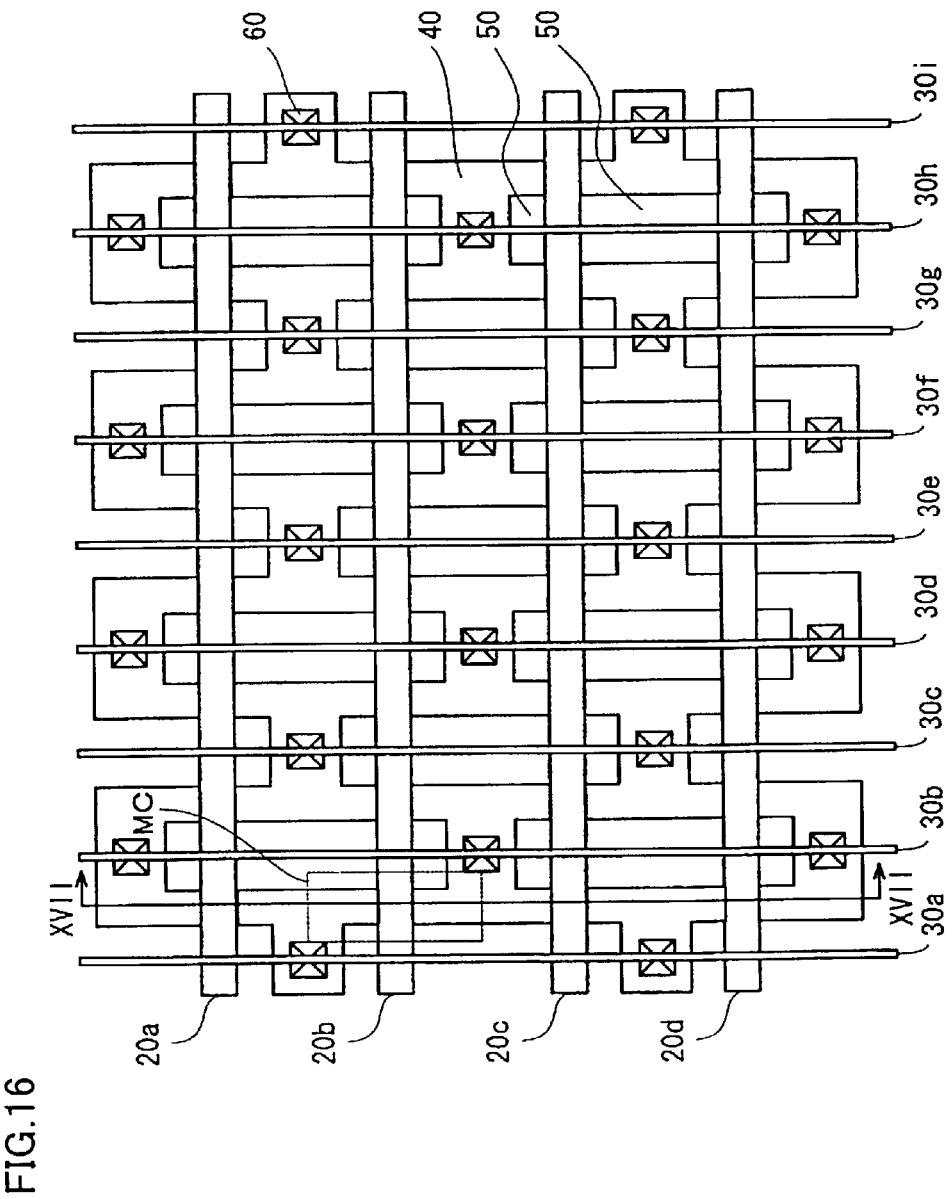
FIG. 16 is a layout view showing the configuration of a memory cell array of a non-volatile semiconductor memory device according to a second embodiment.

FIG. 16 is a layout view showing the configuration of a memory cell array of a non-volatile semiconductor memory device according to the second embodiment of the present invention.

The layout view is the same as that of the first embodiment, of which the description is not repeated.

Figure 17:
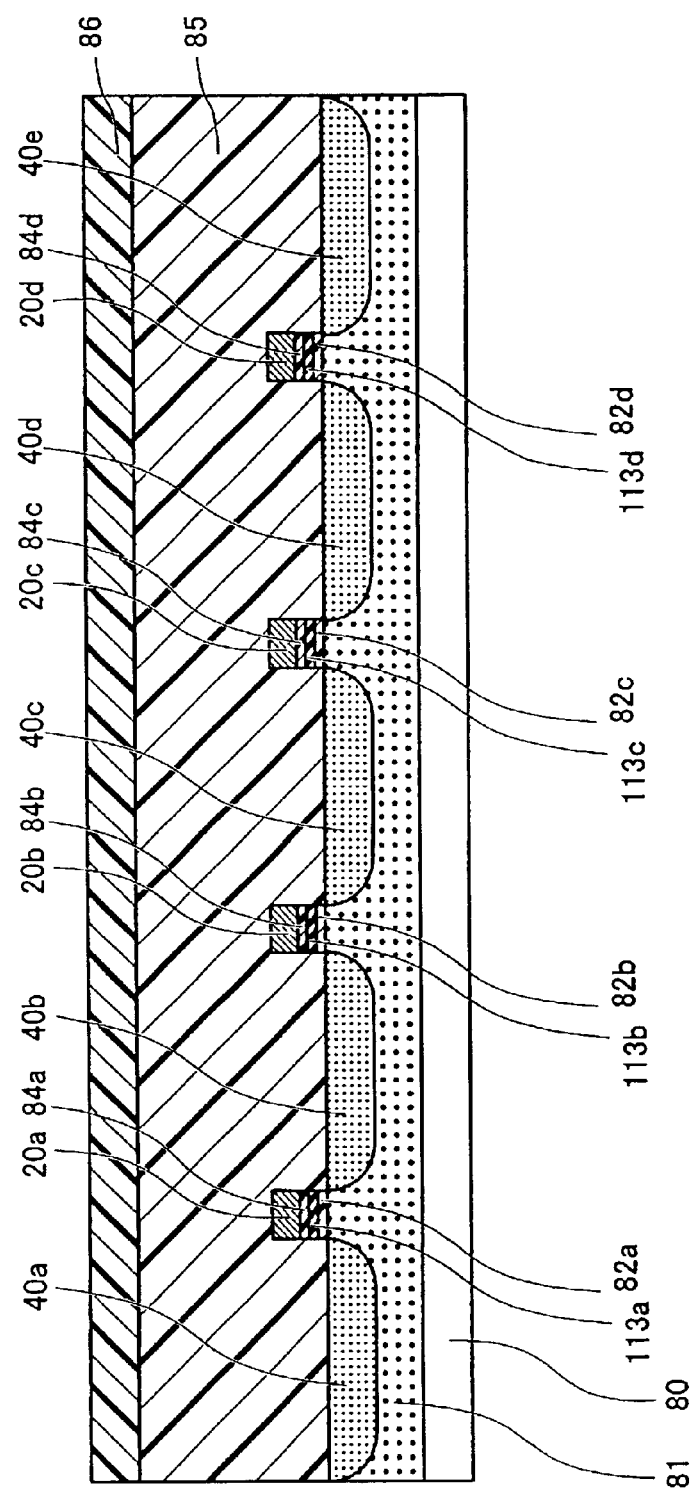
FIG. 17 is a schematic cross sectional view along line segment XVII—XVII in FIG. 16.
Figure 18:
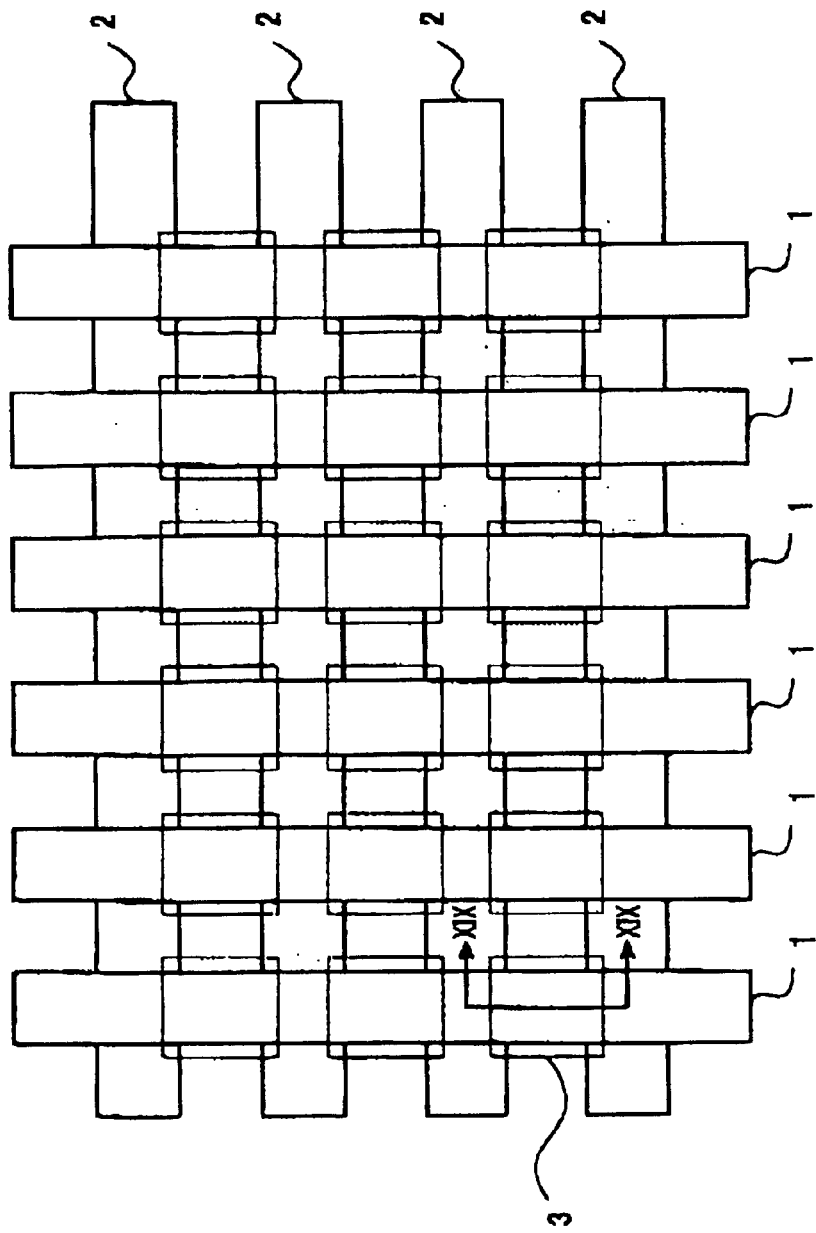
FIG. 18 is a layout view showing a portion of a memory cell array of an NROM according to a prior art.
Figure 19:
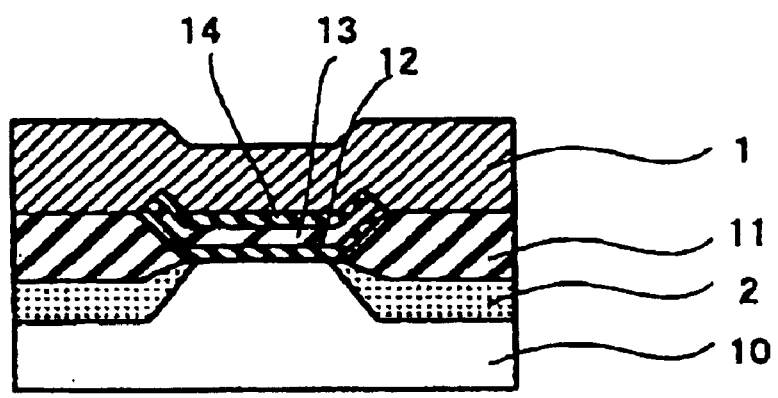
FIG. 19 is a schematic cross sectional view along line segment XIX—XIX in FIG. 18.

FIG. 17 is a schematic cross sectional view along line segment XVII—XVII in FIG. 16.

In reference to FIG. 17, in contrast to FIG. 4, silicon oxide films 113a to 113d including polysilicon microscopic bodies are formed on silicon oxide films 82a to 82d instead of nitride films 83a to 83d. Silicon oxide film 113a has two storage regions, one on the n-type diffusion region 40a side and the other on the n-type diffusion region 40b side, respectively. As a result, one memory cell can store two bits. In the same manner, silicon oxide films 113b to 11 have two storage regions each.

The other parts of the structure are the same as of FIG. 4, of which the descriptions are not repeated.

As a result of this, a silicon oxide film including a great number of polysilicon microscopic bodies can be used as a charge storage layer of one non-volatile memory cell so that a non-volatile semiconductor memory device of the same structure as of the first embodiment can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
   a semiconductor substrate of a first conductive type having a main surface;
   a plurality of conductive regions of a second conductive type formed in said main surface of said semiconductor substrate;
   a plurality of insulating regions formed in said main surface of said semiconductor substrate and arranged so as to alternate with said plurality of conductive regions;
   a first insulating film formed on said main surface of said semiconductor substrate;
   a single charge storage film formed on said first insulating film and having a plurality of storage regions;
   a second insulating film formed on said charge storage film; and
   a plurality of conductive lines formed on said second insulating film; and
   a plurality of bit lines formed on said plurality of conductive lines and connected to said plurality of conductive regions.

2. The non-volatile semiconductor memory device according to claim 1, wherein said plurality of conductive lines are arranged so as to cross said plurality of bit lines.

3. The non-volatile semiconductor memory device according to claim 2, wherein said plurality of insulating regions are arranged in parallel to said plurality of bit lines.

4. The non-volatile semiconductor memory device according to claim 2, wherein said charge storage film is a nitride film.

5. The non-volatile semiconductor memory device according to claim 2, wherein said charge storage film is formed of a silicon oxide including a plurality of polysilicon portions.

6. The non-volatile semiconductor memory device according to claim 1, wherein said plurality of bit lines are made of metal.

7. A non-volatile semiconductor memory device comprising a memory cell array, wherein said memory cell array includes:
   a semiconductor substrate of a first conductive type having a main surface;
   a plurality of conductive lines in rows;
   a plurality of bit lines formed on said plurality of conductive lines and arranged in columns; and
   a plurality of non-volatile memory cells arranged so as to correspond to intersections of the conductive lines and the bit lines, and
   wherein each of said plurality of non-volatile memory cells includes:
      two conductive regions of a second conductive type formed in said main surface of said semiconductor substrate having the corresponding conductive line arranged therebetween and respectively connected to the corresponding two bit lines next to each other among said bit lines;
      a first insulating film formed on said main surface of said semiconductor substrate between said two conductive regions;
      a single charge storage film formed on said first insulating film; and a second insulating film formed on said charge storage film.

8. The non-volatile semiconductor memory device according to claim 7, wherein said non-volatile semiconductor memory device further comprises:

a plurality of insulating regions arranged between said plurality of non-volatile memory cells arranged in columns.

9. The non-volatile semiconductor memory device according to claim 8, wherein said charge storage film includes two storage regions isolated from each other.

10. The non-volatile semiconductor memory device according to claim 8, wherein a electric potential on one of said two conductive regions is higher than that on the other region at time of writing operation and said electric potential on said one region is lower than that on said the other region at time of reading operation.

11. The non-volatile semiconductor memory device according to claim 10, wherein each of said non-volatile memory cells can store data of two bits.

12. The non-volatile semiconductor memory device according to claim 10, wherein said charge storage film is a nitride film.

13. The non-volatile semiconductor memory device according to claim 10, wherein said charge storage film is formed of a silicon oxide including a plurality of polysilicon portions.

* * * * *